United States Patent
Doshita

(10) Patent No.: US 7,166,538 B2
(45) Date of Patent: Jan. 23, 2007

(54) METHOD FOR FABRICATING SEMICONDUCTOR DEVICE

(75) Inventor: Hideki Doshita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 226 days.

(21) Appl. No.: 10/465,648

(22) Filed: Jun. 20, 2003

(65) Prior Publication Data

US 2003/0235987 A1    Dec. 25, 2003

(30) Foreign Application Priority Data

Jun. 25, 2002   (JP) .............................. 2002-184051

(51) Int. Cl.
   *H01L 21/302*   (2006.01)
(52) U.S. Cl. ...................... 438/723; 438/719
(58) Field of Classification Search ............... 438/706, 438/714, 719, 720, 723, 724
   See application file for complete search history.

(56) References Cited

U.S. PATENT DOCUMENTS

| | | | | |
|---|---|---|---|---|
| 4,992,134 | A * | 2/1991 | Gupta et al. ................ | 438/714 |
| 5,812,403 | A * | 9/1998 | Fong et al. .................. | 700/121 |
| 6,083,815 | A * | 7/2000 | Tsai et al. ................... | 438/585 |
| 6,228,712 | B1 * | 5/2001 | Kawai et al. ................ | 438/257 |
| 6,423,644 | B1 * | 7/2002 | Nallan et al. ................ | 438/714 |
| 6,440,870 | B1 * | 8/2002 | Nallan et al. ................ | 438/734 |
| 6,492,283 | B1 * | 12/2002 | Raaijmakers et al. ........ | 438/770 |
| 6,521,963 | B1 * | 2/2003 | Ota et al. .................... | 257/412 |
| 6,605,543 | B1 * | 8/2003 | Zheng ......................... | 438/710 |
| 6,635,185 | B1 * | 10/2003 | Demmin et al. .............. | 216/64 |
| 6,723,652 | B1 * | 4/2004 | Fukuda ........................ | 438/714 |
| 2003/0148622 | A1 * | 8/2003 | Shen et al. .................. | 438/709 |

FOREIGN PATENT DOCUMENTS

| | | |
|---|---|---|
| JP | 07-263406 | 10/1995 |
| JP | 11-220123 | 8/1999 |
| JP | 2000-252259 | 9/2000 |
| JP | 2002-075967 | 3/2002 |

OTHER PUBLICATIONS

Corresponding Japanese Office Action dated Aug. 1, 2006 with English Translation thereof. (JP2002-075967).

* cited by examiner

*Primary Examiner*—Kin-Chan Chen
(74) *Attorney, Agent, or Firm*—McDermott Will & Emery LLP

(57) ABSTRACT

After forming a gate insulating film on a semiconductor substrate, a silicon film is deposited on the gate insulating film, and a high-melting point metal film is deposited on the silicon film. After forming a hard mask made of a silicon oxide film or a silicon nitride film on the high-melting point metal film, the high-melting point metal film is dry etched by using the hard mask as a mask. After removing a residue or a natural oxide film present on the silicon film through dry etching, the silicon film is dry etched by using the hard mask as a mask. The residue or the natural oxide film is removed while suppressing excessive etching of the silicon film.

5 Claims, 13 Drawing Sheets

METHOD FOR FABRICATING SEMICONDUCTOR DEVICE

BACKGROUND OF THE INVENTION

The present invention relates to a method for fabricating a semiconductor device including a polymetal gate electrode made of a multilayer structure composed of a silicon film, a barrier film and a high-melting point metal film.

Recently, the performance of semiconductor devices has been remarkably improved, and there are increasing demands for a higher operation speed and lower power consumption of semiconductor devices. For example, in a fine semiconductor device having a gate width of 0.15 µm or less, for further improvement of the performance of transistors, heteropolar electrodes, that is, a $p^+$-type electrode used for a P channel transistor and an $n^+$-type electrode used for an N channel transistor, have been started to be used as gate electrodes instead of conventionally used $n^+$-type homopolar electrodes.

Also, in order to further increase the operation speed and further reduce the power consumption of a semiconductor device, it is necessary to further lower the resistance of a gate electrode.

Furthermore, in order to secure an overlapping margin between a gate electrode and a contact region, self aligned contact (SAC) process has been employed.

A polymetal electrode is regarded as a promising gate electrode structure capable of meeting these requirements. A polymetal electrode is a kind of gate electrode structures, and differently from a general gate electrode of a polysilicon film alone, it has a multilayer structure composed of a lower polysilicon film, an upper metal film of tungsten or the like and a barrier metal deposited on the polysilicon film for preventing interdiffusion between the polysilicon film and the metal film.

Since a polymetal electrode can attain lower resistance than a gate electrode of polysilicon alone, a higher operation speed and lower power consumption of a device can be realized. In addition, since it matches with the SAC process, it can be suitably employed for increasing the degree of integration.

Now, a method for fabricating a semiconductor device having a polymetal electrode structure will be described with reference to FIGS. 11A through 11D and 12A through 12C.

First, as shown in FIG. 11A, a gate insulating film 11 of a silicon oxide film with a thickness of, for example, 3 nm is formed on a semiconductor substrate 10 of silicon or the like by, for example, thermal oxidation. Thereafter, a polysilicon film 12 with a thickness of, for example, 100 nm is deposited on the gate insulating film 11 by, for example, CVD.

Next, as shown in FIG. 11B, after forming a first resist pattern 13 in a first predetermined portion on the polysilicon film 12, a group V impurity 14 of phosphorus (P) or the like is implanted into the polysilicon film 12 by ion implantation at a dose of, for example, $1\times10^{16}/cm^2$, so as to form an n-type polysilicon film 15.

Then, as shown in FIG. 11C, after removing the first resist pattern 13 by ashing and cleaning, a second resist pattern 16 is formed in a second predetermined portion on the polysilicon film 12. Thereafter, a group III impurity 17 of boron (B) or the like is implanted into the polysilicon film 12 by the ion implantation at a dose of, for example, $1\times10^{15}/cm^2$, so as to form a p-type polysilicon film 18.

Subsequently, as shown in FIG. 11D, a tungsten nitride film 19 with a thickness of, for example, 10 nm, a tungsten film 20 with a thickness of, for example, 100 nm and a silicon nitride film 21 with a thickness of, for example, 150 nm are successively deposited on the n-type polysilicon film 15 and the p-type polysilicon film 18 by sputtering or CVD.

Next, as shown in FIG. 12A, after forming a chemically amplified resist film on the silicon nitride film 21, the chemically amplified resist film is subjected to lithography using KrF excimer laser as exposing light, so as to form a third resist pattern 22.

Then, a first etching system is used for etching the silicon nitride film 21 with the third resist pattern 22 used as a mask as shown in FIG. 12B, so as to form a patterned silicon nitride film 21A. Thereafter, the third resist pattern 22 is removed by the ashing and the cleaning.

Subsequently, a second etching system is used for anisotropically etching the tungsten film 20, the tungsten nitride film 19, the n-type polysilicon film 15 and the p-type polysilicon film 18 with the patterned silicon nitride film 21A used as a mask as shown in FIG. 12C, so as to form a patterned tungsten film 20A, a patterned tungsten nitride film 19A, a patterned n-type polysilicon film 15A and a patterned p-type polysilicon film 18A.

In this manner, an n-type polymetal gate electrode 23 composed of the patterned silicon nitride film 21A, the patterned tungsten film 20A, the patterned tungsten nitride film 19A and the patterned n-type polysilicon film 15A is formed, and a p-type polymetal gate electrode 24 composed of the patterned silicon nitride film 21A, the patterned tungsten film 20A, the patterned tungsten nitride film 19A and the patterned p-type polysilicon film 18A is formed. In the structures of these polymetal gate electrodes, the patterned tungsten nitride film 19A functions as a barrier film for preventing interdiffusion between the patterned tungsten film 20A and the patterned n-type polysilicon film 15A or the patterned p-type polysilicon film 18A, and the patterned silicon nitride film 21A functions as a stopper film in the SAC process.

The anisotropic etching employed for forming the n-type and p-type polymetal gate electrodes 23 and 24 is conventionally performed through multiple steps as follows as described in Japanese Laid-Open Patent Publication No. 2000-252259: The tungsten film 20 and the tungsten nitride film 21 are etched under the same conditions, and thereafter, the conditions are changed to etch a residue of the tungsten nitride film 21 and a natural oxide film (with a thickness of several nm) present on the n-type and p-type polysilicon films 15 and 18. Then, the conditions are changed again for main etching of the n-type and p-type polysilicon films 15 and 18, and ultimately, the n-type and p-type polysilicon films 15 and 18 are over-etched. Furthermore, in the etching of the tungsten film 20 and the tungsten nitride film 21, a mixed gas of a F-base gas, an $O_2$ gas, a $N_2$ gas and one of a $Cl_2$ gas and a HBr gas is used; in the etching of the residue of the tungsten nitride film 21 and the natural oxide film, a $Cl_2$ gas is used; and in the etching of the n-type and p-type polysilicon films 15 and 18, a mixed gas of a $Cl_2$ gas, a HBr gas and an $O_2$ gas is used. Moreover, in the main etching of the n-type and p-type polysilicon films 15 and 18, etching end point detection using plasma spectroscopic analysis is generally employed.

However, when the anisotropic etching for forming the n-type and p-type polymetal gate electrodes 23 and 24 is carried out as described above, there arises a problem that punch-through is locally caused in the gate insulating film 11 formed below the n-type polysilicon film 15.

Accordingly, the present inventor has studied the cause of punch-through of the gate insulating film 11, resulting in finding the following two causes:

The first cause will be first described with reference to FIGS. 13A through 13C.

FIG. 13A shows a cross-sectional structure obtained immediately after etching the tungsten film 20 and the tungsten nitride film 21 with the patterned silicon nitride film 21A used as a mask by using a mixed gas of a F-based gas, an $O_2$ gas, a $N_2$ gas, and one of a $Cl_2$ gas and a HBr gas.

As described above, the group V impurity 14 of phosphorus (P) or the like has been implanted into the n-type polysilicon film 15 at a dose of $1 \times 10^{16}/cm^2$. The amount of an impurity that can be doped in the polysilicon film 12 (namely, the solubility limit) is determined depending upon the concentration of the impurity and the process temperature.

In the n-type polymetal gate electrode 23, the n-type polysilicon film 15 has a thickness of 100 nm and the does of phosphorus (P) is $1 \times 10^{16}/cm^2$, and therefore, the phosphorus concentration in the n-type polysilicon film 15 is approximately $1 \times 10^{21}/cm^3$. Also, the silicon nitride film 21 is deposited by the CVD at a temperature of approximately 750° C.

Accordingly, the phosphorus concentration in the n-type polysilicon film 15 is higher than the solubility limit of phosphorus in a temperature region around 750° C. (that is, approximately $1 \times 10^{20}/cm^3$). Excessive phosphorus (P) 25 that cannot be dissolved in the polysilicon film 12 is deposited in a grain boundary of the n-type polysilicon film 15.

FIG. 13B shows a cross-sectional structure obtained immediately after removing, by using a $Cl_2$ gas, a residue of the tungsten nitride film, and a fluorocarbon deposit film and a natural oxide film present on the n-type polysilicon film 15. In this procedure, the n-type polysilicon film 15 is also etched in addition to the residue of the tungsten nitride film, the fluorocarbon deposit film and the natural oxide film. In the etching of the n-type polysilicon film 15 by using a halogen gas, it is known that the etching rate of the n-type polysilicon film 15 depends upon an impurity concentration in the n-type polysilicon film 15, and that the etching rate of the n-type polysilicon film 15 is higher as the concentration of a group V impurity is higher.

In the n-type polysilicon film 15 shown in FIG. 13A, the phosphorus concentration in the polysilicon grain boundary where the phosphorus has been deposited is high. Therefore, when the residue of the tungsten nitride film, the fluorocarbon deposit film and the natural oxide film are removed by using the $Cl_2$ gas, the etching rate in the grain boundary of the n-type polysilicon film 15 is higher than the etching rate in the other portion. As a result, a groove 26 is formed in the grain boundary of the polysilicon film as shown in FIG. 13B.

When the groove 26 reaches the gate insulating film 11 formed below the n-type polysilicon film 15, punch-through 27 is caused in the gate insulating film 11 as shown in FIG. 13C. Also, even when the groove 26 does not reach the gate insulating film 11, the gate insulating film 11 is excessively etched in the subsequently performed main etching and over-etching of the n-type polysilicon film 15, and hence, the punch-through 27 is caused.

Next, the second cause will be described with reference to FIGS. 14A through 14C.

FIG. 14A shows a cross-sectional structure obtained immediately after etching the tungsten film 20 and the tungsten nitride film 21 with the patterned silicon nitride film 21A used as a mask by using a mixed gas of a F-based gas, an $O_2$ gas, a $N_2$ gas and one of a $Cl_2$ gas and a HBr gas.

In this case, the polysilicon film into which the impurity has been introduced may be any of the n-type polysilicon film 15 and the p-type polysilicon film 18, and a patterned titanium nitride film 28 A is used as a barrier film.

As shown in FIG. 14A, a residue 29 of the titanium nitride film, a fluorocarbon deposit film 30 generated and deposited during dry etching of the tungsten film and the titanium nitride film and a natural oxide film (not shown) are present on the n-type or p-type polysilicon film 15 or 18.

The principal components of the residue 29 of the titanium nitride film are a titanium fluoride ($TiF_x$) and a titanium oxide ($TiO_x$) generated through a reaction between titanium of the titanium nitride film and F and O present in plasma.

FIG. 14B shows a cross-sectional structure obtained immediately after removing, by using a $Cl_2$ gas, the residue 29 of the titanium nitride film, the fluorocarbon deposit film 30 and the natural oxide film present on the n-type or p-type polysilicon film 15 or 18. In this procedure, the n-type or p-type polysilicon film 15 or 18 is also etched in addition to the residue 29 of the titanium nitride film, the fluorocarbon deposit film 30 and the natural oxide film. There are two points to be considered in this procedure.

The first point is that "the residue 29 of the titanium nitride film, the fluorocarbon deposit film 30 and the natural oxide film should be completely removed". If the residue 29 of the titanium nitride film, the fluorocarbon deposit film 30 and the natural oxide film are not completely removed in this procedure, the residue 29 of the titanium nitride film, the fluorocarbon deposit film 30 and the natural oxide film cannot be removed through the subsequently performed main etching and over-etching of the n-type or p-type polysilicon film 15 or 18, and therefore, the residue remains after the etching of the n-type or p-type polysilicon film 15 or 18 and unavoidably causes a short-circuit of a gate interconnect.

The second point is that "the n-type or p-type polysilicon film 15 or 18 formed below the titanium nitride film should not be excessively etched". When the n-type or p-type polysilicon film 15 or 18 formed below the titanium nitride film is excessively etched, the remaining thickness of the n-type or p-type polysilicon film 15 or 18 becomes small. Therefore, the etching end point cannot be stably detected in the subsequently performed main etching of the n-type or p-type polysilicon film 15 or 18, and hence, punch-through is caused in the gate insulating film 11 as shown in FIG. 14C.

At this point, the removal of the residue 29 of the titanium nitride film by using a $Cl_2$ gas will be considered. The principal components of the residue 29 of the titanium nitride are a titanium fluoride and a titanium oxide that have large bonding energy and a very high boiling point. Therefore, in the etching using a $Cl_2$ gas, the following reactions are minimally caused:

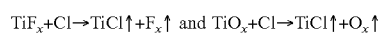
$TiF_x + Cl \rightarrow TiCl\uparrow + F_x\uparrow$ and $TiO_x + Cl \rightarrow TiCl\uparrow + O_x\uparrow$ Accordingly, the etching rates of the titanium fluoride and the titanium oxide cannot be increased.

On the other hand, in the etching of the n-type or p-type polysilicon film 15 or 18, a reaction, $Si + Cl \rightarrow SiCl\uparrow$, is easily caused, and hence, the etching rate of the n-type or p-type polysilicon film 15 or 18 is unavoidably high.

Accordingly, the etch selectivity between the residue 29 of the titanium nitride film including the titanium fluoride and the titanium oxide and the n-type or p-type polysilicon film 15 or 18 is unavoidably very small.

Therefore, in the case where the residue 29 of the titanium nitride film, the fluorocarbon deposit film 30 and the natural oxide film are to be completely removed in this procedure, the etching should be carried out for a long time for completely removing the residue 29 of the titanium nitride film, during which the n-type or p-type polysilicon film 15 or 18 not covered with the residue 29 of the titanium nitride film is excessively etched. As a result, the remaining thickness of the n-type or p-type polysilicon film 15 or 18 is small as shown in FIG. 14B.

When the remaining thickness of the n-type or p-type polysilicon film 15 or 18 is small, the etching end point cannot be stably detected in the subsequently performed main etching of the n-type or p-type polysilicon film 15 or 18. As a result, punch-through 31 is caused in the gate insulating film 11 as shown in FIG. 14C.

In conclusion, the causes of the punch-through of the gate insulating film are: (1) since the concentration of the group V impurity in the silicon film exceeds the solubility limit, the silicon film is excessively etched in its grain boundary in the procedure for removing the residue of the barrier film of a tungsten nitride film or a titanium nitride film and the natural oxide film present on the silicon film; and (2) when the barrier film is made of a titanium nitride film, the silicon film is excessively etched in the procedure for removing the residue of the titanium nitride film or the natural oxide film present on the silicon film.

SUMMARY OF THE INVENTION

In consideration of the aforementioned conventional problems, an object of the invention is preventing a gate insulating film from having damage such as punch-through in forming, by dry etching, a gate electrode having a polymetal structure on the gate insulating film.

In order to achieve the object, according to the invention, the damage such as punch-through of the gate insulating film is avoided by preventing a silicon film from being excessively etched in removing a residue or a natural oxide film by dry etching.

Specifically, the method for fabricating a semiconductor device of this invention includes the steps of forming a gate insulating film on a semiconductor substrate; depositing a silicon film on the gate insulating film; depositing a high-melting point metal film on the silicon film; forming a hard mask made of a silicon oxide film or a silicon nitride film on the high-melting point metal film; dry etching the high-melting point metal film by using the hard mask as a mask; removing a residue or a natural oxide film present on the silicon film by dry etching; and dry etching the silicon film by using the hard mask as a mask, and the step of removing a residue or a natural oxide film is performed while suppressing excessive etching of the silicon film.

In the method for fabricating a semiconductor device of this invention, the step of removing a residue or a natural oxide film by dry etching is performed while suppressing excessive etching of the silicon film. Therefore, the thickness of the silicon film is not much reduced after removing the residue or the natural oxide film, and hence, punch-through is minimally caused in the gate insulating film in the etching of the silicon film.

In the method for fabricating a semiconductor device of this invention, an etching gas used in the step of removing a residue or a natural oxide film is preferably a mixed gas of a gas including chlorine and one of a HBr gas, a N₂ gas and an O₂ gas.

Thus, even in the case where the concentration of a group V impurity in the silicon film is higher than the solubility limit in the silicon film and hence the group V impurity is excessively deposited in a grain boundary of the silicon film, damage such as punch-through of the gate insulating film starting from the grain boundary of the silicon film can be prevented. The reason will be described with reference to FIGS. 10A through 10C.

FIG. 10A shows a cross-sectional structure obtained immediately after etching, using a mixed gas of a F-based gas, an O₂ gas, a N₂ gas and one of a Cl₂ gas and a HBr gas, the tungsten film 20 and the tungsten nitride film 21 deposited on the n-type polysilicon film 15 with the patterned silicon nitride film 21A used as a mask in the conventional method for fabricating a semiconductor device shown in FIGS. 11A through 11D and 12A through 12C.

In this case, the concentration of phosphorus in the n-type polysilicon film 15 exceeds the solubility limit in a polysilicon film, and hence, the phosphorus is deposited in a grain boundary of the silicon film. In the procedure for removing a residue of the tungsten nitride film and a natural oxide film present on the n-type polysilicon film 15, during the etching of the n-type polysilicon film 15, reactions of the following formulas (1) through (3) are proceeded, so that a polycrystallized layer 32 having low volatility and made from $SiBr_x$, $SiN_x$ or $SiO_x$ can be formed on the n-type polysilicon film 15:

| Formula (1): | $Si + HBr + Cl \rightarrow SiBr_x + SiCl_y + H$ |
| Formula (2): | $Si + N_2 + Cl \rightarrow SiN_x + SiCl_y$ |
| Formula (3): | $Si + O_2 + Cl \rightarrow SiO_2 + SiCl_y$ |

When a silicon film is etched by using a single Cl-based gas, the etching rate in a grain boundary of the silicon film is higher owing to the influence of the phosphorus deposited in the grain boundary, resulting in forming a groove in the grain boundary of the silicon film.

When a HBr gas, a N₂ gas or an O₂ gas is added to the gas including chlorine, however, the polycrystallized layer 32 having low volatility is generated during the etching of the silicon film as shown in FIG. 10B. The polycrystallized layer 32 covers the groove having been formed in the grain boundary of the silicon film, and hence, increase of the groove can be suppressed.

Since the polycrystallized layer 32 thus suppresses the increase of the groove, damage such as punch-through of the gate insulating film starting from the grain boundary of the silicon film can be prevented as shown in FIG. 10C.

In the method for fabricating a semiconductor device of this invention, an etching gas used in the step of removing a residue or a natural oxide film is preferably a mixed gas of a gas including chlorine and a fluorocarbon gas.

Thus, even in the case where the concentration of a group V impurity in the silicon film is higher than the solubility limit in the silicon film and hence the group V impurity is excessively deposited in a grain boundary of the silicon film, damage such as punch-through of the gate insulating film starting from the grain boundary of the silicon film can be prevented. The reason will now be described. In the etching of the silicon film, a fluorocarbon film having a high depositing property is generated through decomposition of the fluorocarbon gas. This fluorocarbon film covers a groove having been formed in the grain boundary of the silicon film, and hence, increase of the groove can be suppressed. Since the fluorocarbon film thus suppresses the increase of the groove, damage such as punch-through of the gate insulating film starting from the grain boundary of the silicon film can be prevented.

In the method for fabricating a semiconductor device of this invention, an etching gas used in the step of removing a residue or a natural oxide film is preferably a mixed gas of a gas including chlorine and an inert gas.

Thus, even in the case where the concentration of a group V impurity in the silicon film is higher than the solubility limit in the silicon film and hence the group V impurity is excessively deposited in a grain boundary of the silicon film, damage such as punch-through of the gate insulating film starting from the grain boundary of the silicon film can be prevented. The reason will now be described. When a silicon film is etched by using a gas including chlorine, the etching is proceeded dominantly by a chemical reaction between chlorine radicals generated in plasma and the silicon film. Also, in the etching proceeded dominantly by the chemical reaction between the chlorine radicals and the silicon film, as the concentration of the group V impurity in the silicon film is higher (namely, as the trend toward n-type is larger), the etching rate of the silicon film is higher. Owing to this phenomenon, a groove is formed in a grain boundary of the silicon film in removing a residue of a barrier film and a natural oxide film present on the silicon film.

In contrast, when a silicon film is etched by using the mixed gas of a gas including chlorine and an inert gas, the amount of chlorine radicals generated in the plasma can be reduced due to dilution with the inert gas, and therefore, the etching is proceeded dominantly by a physical function of sputtering with inert gas ions. In the etching proceeded dominantly by the physical function of the sputtering with inert gas ions, the etching rate of the silicon film does not depend upon the concentration of the group V impurity in the silicon film. Accordingly, when the mixed gas of a gas including chlorine and an inert gas is used in removing the residue of the barrier film and the natural oxide film, no groove is formed in a grain boundary of the silicon film, so that damage such as punch-through of the gate insulating film starting from a gain boundary of the silicon film can be prevented.

In the case where the etching gas includes an inert gas, the inert gas can be a He gas, a Ne gas, an Ar gas, a Xe gas or a Kr gas.

In the method for fabricating a semiconductor device of this invention, the step of removing a residue or a natural oxide film preferably includes a sub-step of cooling the semiconductor substrate.

Thus, even in the case where the concentration of a group V impurity in the silicon film is higher than the solubility limit in the silicon film and hence the group V impurity is excessively deposited in a grain boundary of the silicon film, damage such as punch-through of the gate insulating film starting from the grain boundary of the silicon film can be prevented. The reason will now be described. When the semiconductor substrate is cooled, a reaction product generated during the etching of the silicon film can attain a high property to deposit on the silicon film. Therefore, the reaction product has a high property to cover a groove having been formed in the grain boundary of the silicon film, so as to suppress increase of the groove. Since a film of the reaction product thus suppresses the increase of the groove, damage such as punch-through of the gate insulating film starting from the grain boundary of the silicon film can be prevented.

In this case, the semiconductor substrate is preferably cooled to a temperature of 0° C. through 20° C.

Thus, the film of the reaction product can definitely suppress the increase of the groove, and hence, damage such as punch-through of the gate insulating film starting from the grain boundary of the silicon film can be definitely prevented.

In the method for fabricating a semiconductor device of this invention, the silicon film is preferably an amorphous silicon film, and the step of depositing a high-melting point metal film, the step of forming a hard mask and the step of removing a residue or a natural oxide film are carried out preferably at a temperature lower than 550° C.

Thus, even in the case where the concentration of a group V impurity in the silicon film is higher than the solubility limit in the silicon film, damage such as punch-through of the gate insulating film starting from a grain boundary of the silicon film can be prevented. This is because, since the temperature of heat applied from implantation of the group V impurity to etching of the polymetal structure is lower than 550° C., the amorphous silicon film is not polycrystallized, so as to reduce the number of grain boundaries formed in the silicon film.

DETAILED DESCRIPTION OF THE INVENTION

Embodiment 1

A method for fabricating a semiconductor device according to Embodiment 1 of the invention will now be described with reference to FIGS. 1A through 1D and 2A through 2C. In Embodiment 1, an implanted impurity is prevented from depositing in a grain boundary of a silicon film of a polymetal structure.

Figure 1A:
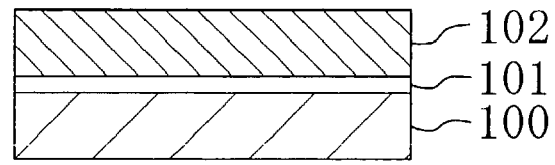
FIGS. 1A, 1B, 1C and 1D are cross-sectional views for showing procedures in a method for fabricating a semiconductor device according to Embodiment 1 of the invention.

First, as shown in FIG. 1A, a gate insulating film 101 of a silicon oxide film with a thickness of, for example, 3 nm is formed on a semiconductor substrate 100 of silicon or the like by, for example, thermal oxidation. Thereafter, a polysilicon film 102 with a thickness of, for example, 100 nm is deposited on the gate insulating film 101 by, for example, CVD.

Figure 1B:
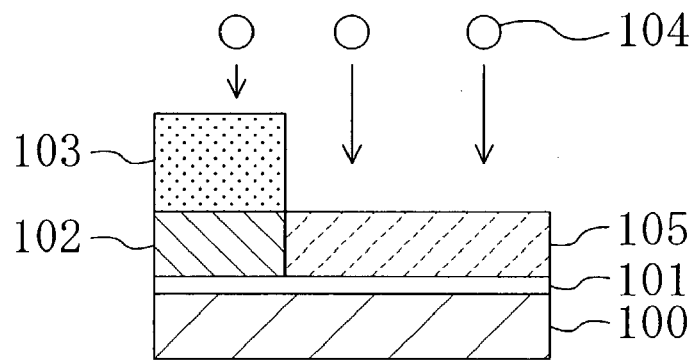

Next, as shown in FIG. 1B, after forming a first resist pattern 103 in a first predetermined portion on the polysilicon film 102, a group V impurity 104 of phosphorus (P) or the like is implanted into the polysilicon film 102 by ion implantation at a dose of, for example, $5 \times 10^{14}/cm^2$, so as to form an n-type polysilicon film 105.

Figure 1C:
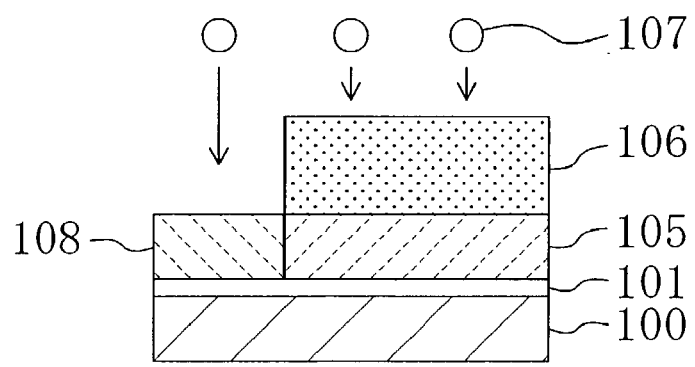

Then, as shown in FIG. 1C, after removing the first resist pattern 103 by ashing and cleaning, a second resist pattern 106 is formed in a second predetermined portion on the polysilicon film 102. Thereafter, a group III impurity 107 of boron (B) or the like is implanted into the polysilicon film 102 by the ion implantation at a dose of, for example, $1 \times 10^{15}/cm^2$, so as to form a p-type polysilicon film 108.

Figure 1D:
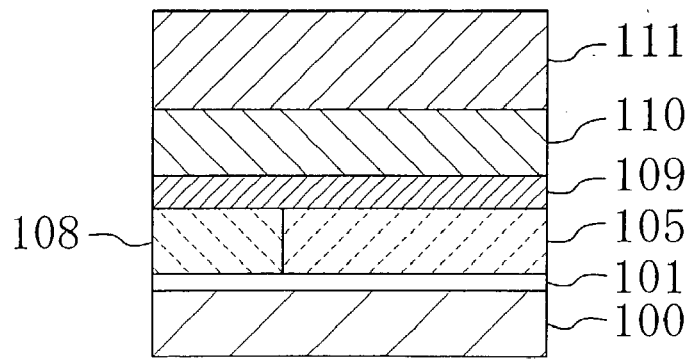

Subsequently, as shown in FIG. 1D, a tungsten nitride film 109 with a thickness of, for example, 10 nm, a tungsten film 110 with a thickness of, for example, 100 nm and a silicon nitride film 111 with a thickness of, for example, 150 nm are successively deposited on the n-type polysilicon film 105 and the p-type polysilicon film 108 by sputtering or CVD.

Figure 2A:
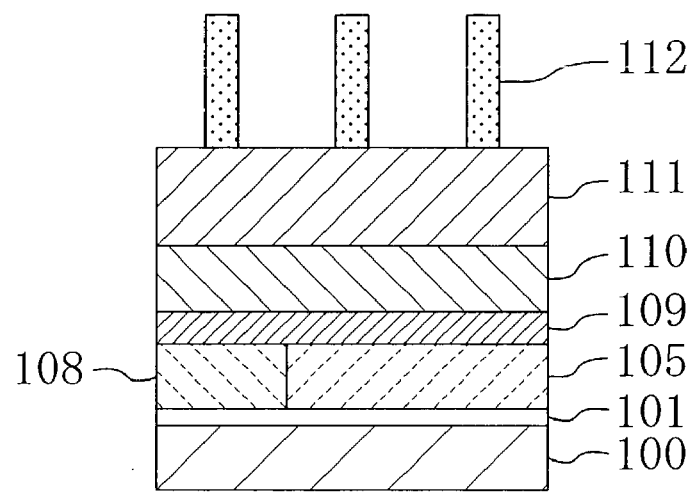
FIGS. 2A, 2B and 2C are cross-sectional views for showing other procedures in the method for fabricating a semiconductor device of Embodiment 1.

Next, as shown in FIG. 2A, after forming a chemically amplified resist film on the silicon nitride film 111, the chemically amplified resist film is subjected to lithography using KrF excimer laser as exposing light, so as to form a third resist pattern 112.

Figure 2B:
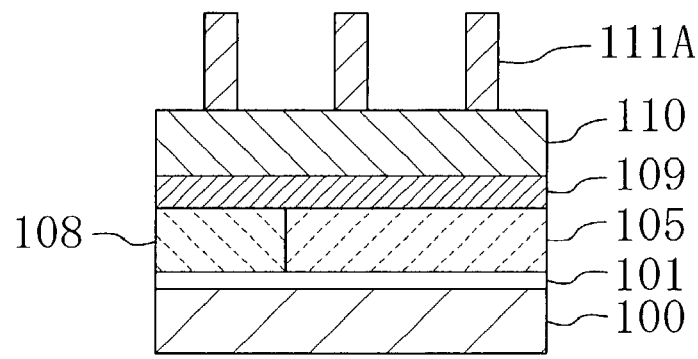
Figure 3:
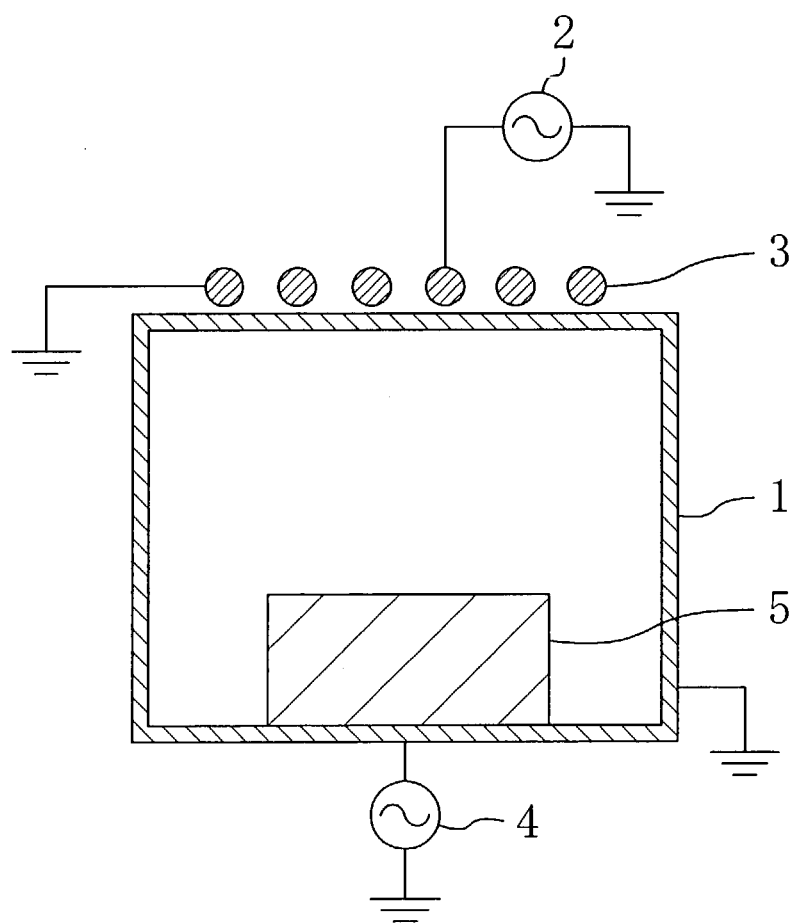
FIG. 3 is a schematic cross-sectional view of an etching system used in a method for fabricating a semiconductor device of each embodiment of the invention.

Then, an inductively coupled plasma etching system as shown in FIG. 3 is used for forming a patterned silicon nitride film 111A working as a hard mask by etching the silicon nitride film 111 with the third resist pattern 112 used as a mask, and the third resist pattern 112 is then removed by the ashing and the cleaning as shown in FIG. 2B. The hard mask may be a patterned silicon oxide film instead of the patterned silicon nitride film 111A.

Figure 2C:
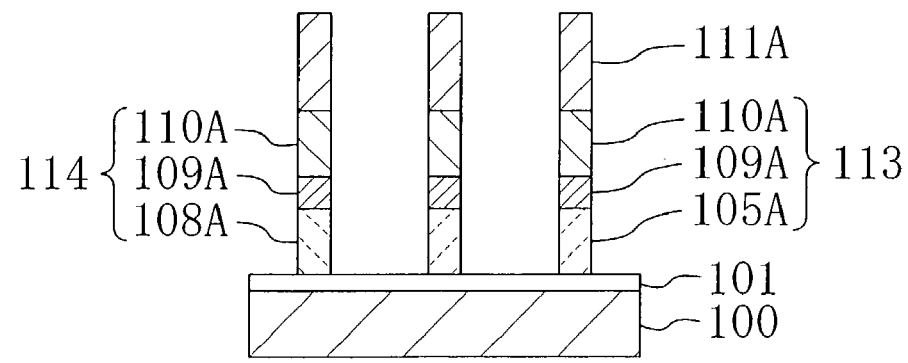

Next, the same inductively coupled plasma etching system of FIG. 3 is used for carrying out anisotropic etching, by using the patterned silicon nitride film 111A as a mask, on the tungsten film 110, the tungsten nitride film 109, the n-type polysilicon film 105 and the p-type polysilicon film 108 as shown in FIG. 2C. Thus, a patterned tungsten film 110A, a patterned tungsten nitride film 109A, a patterned n-type polysilicon film 105A and a patterned p-type polysilicon film 108A are formed.

In this manner, an n-type polymetal gate electrode 113 composed of the patterned tungsten film 110A, the patterned tungsten nitride film 109A and the patterned n-type polysilicon film 105A is formed, and a p-type polymetal gate electrode 114 composed of the patterned tungsten film 110A, the patterned tungsten nitride film 109A and the patterned p-type polysilicon film 108A is formed.

At this point, the inductively coupled plasma etching system used for the etching of the silicon nitride film 111 and the etching of the tungsten film 110, the tungsten nitride film 109, the n-type polysilicon film 105 and the p-type polysilicon film 108 will be described with reference to FIG. 3.

As shown in FIG. 3, a chamber 1 is grounded and has an inner wall covered with an insulator such as ceramic, alumina or quartz, and an induction coil (upper electrode) 3 to which first RF power is applied by a first RF power source 2 is disposed on the chamber 1. When the first RF power is applied to the induction coil 3, inductively coupled plasma is generated within the chamber 1.

A sample table (lower electrode) 5 to which second RF power is applied by a second RF power source 4 is disposed on the bottom of the chamber 1, so that energy of ions accelerated toward the sample table 5 is controlled in accordance with the second RF power. Although not shown in the drawing, a temperature controller for controlling the temperature of the sample table 5 with a coolant or the like in the range of −30° C. to +30° C. is provided within the sample table 5.

An etching gas is introduced into the chamber 1 from an inlet (not shown) through a mass flow controller (not shown), and the pressure within the chamber 1 is controlled in the range of approximately 0.1 Pa to 10 Pa by a turbo pump (not shown).

The conditions for the etching performed for forming the polymetal gate electrodes in Embodiment 1 will now be described.

(1) Conditions for etching of tungsten film 110 and tungsten nitride film 109:
Pressure: 1 Pa
First RF power: 400 W (13.56 MHz)
Second RF power: 30 W (13.56 MHz)
Flow rate of $CF_4$ gas: 100 ml/min.
Flow rate of $O_2$ gas: 20 ml/min.
Flow rate of HBr gas: 5 m/min.
Flow rate of $N_2$ gas: 2 ml/min.
Temperature of sample table: 20° C.
The etching time is determined through automatic end point detection by measuring the emission frequency of $WF_x$.

(2) Conditions for removing residue of tungsten nitride film 109 and natural oxide film present on n-type polysilicon film 105 and p-type polysilicon film 108:
Pressure: 0.4 Pa
First RF power: 400 W (13.56 MHz)
Second RF power: 60 W (13.56 MHz)
Flow rate of $Cl_2$ gas: 100 ml/min.
Temperature of sample table: 20° C.
Etching time: 10 seconds (3) Conditions for main etching of n-type polysilicon film 105 and p-type polysilicon film 108:
Pressure: 0.4 Pa
First RF power: 400 W (13.56 MHz)
Second RF power: 20 W (13.56 MHz)

Flow rate of $Cl_2$ gas: 50 ml/min.
Flow rate of HBr gas: 50 ml/min.
Flow rate of $O_2$ gas: 2 ml/min.
Temperature of sample table: 20° C.

The etching time is determined through the automatic end point detection by measuring the emission frequency of $SiBr_x$.

(4) Conditions for over-etching of n-type polysilicon film 105 and p-type polysilicon film 108:
Pressure: 3 Pa
First RF power: 400 W (13.56 MHz)
Second RF power: 50 W (13.56 MHz)
Flow rate of HBr gas: 100 ml/min.
Flow rate of $O_2$ gas: 10 ml/min.
Temperature of sample table: 20° C.
Etching time: 50 seconds In Embodiment 1, the concentration of the phosphorus 104 in the n-type polysilicon film 105 is $5 \times 10^{19}/cm^3$, which is smaller than the limit (solubility limit) of the impurity solvable in the n-type polysilicon film 105, that is, $1 \times 10^{20}/cm^3$. Therefore, the phosphorus is not deposited in a grain boundary of the n-type polysilicon film 105. Accordingly, in the etching for removing the residue of the tungsten nitride film 109 and the natural oxide film present on the n-type polysilicon film 105 and the p-type polysilicon film 108, no groove is formed in the grain boundary of the n-type polysilicon film 105. As a result, the polymetal gate electrodes can be formed without causing punch-through in the gate insulating film 101 starting from the grain boundary of the n-type polysilicon film 105.

Embodiment 2

A method for fabricating a semiconductor device according to Embodiment 2 of the invention will now be described. As a characteristic of Embodiment 2, in the case where a group V impurity is deposited in a grain boundary of a polysilicon film included in a polymetal structure, chlorine is included in an etching gas used for removing a residue of a barrier film and a natural oxide film present on the polysilicon film. The conditions for the etching of a tungsten film 110 and a tungsten nitride film 109 and the conditions for the main etching and the over-etching of an n-type polysilicon film 105 and a p-type polysilicon film 108 are the same as those employed in Embodiment 1. Accordingly, three conditions for removing the residue and the natural oxide film alone will be herein described.

(1) First conditions employed when the etching gas is a mixed gas of $Cl_2$ and HBr:
Pressure: 0.4 Pa
First RF power: 400 W (13.56 MHz)
Second RF power: 60 W (13.56 MHz)
Flow rate of $Cl_2$ gas: 50 ml/min.
Flow rate of HBr gas: 50 ml/min.
Temperature of sample table: 20° C.
Etching time: 10 seconds In the first conditions, the volume proportion of the HBr gas in the whole etching gas is 10% or more. Therefore, a groove formed in a grain boundary of the n-type polysilicon film 105 can be reduced owing to an etching protection function of $SiBr_x$ generated during the etching, and hence, damage such as punch-through of a gate insulating film 101 can be avoided.

In the case where the volume proportion of the HBr gas exceeds 70%, $WBr_x$ with low volatility is excessively generated during the etching, and hence, the residue of the tungsten nitride film cannot be sufficiently removed. As a result, there is a fear of defective of an etching residue caused after forming a polymetal electrode.

Accordingly, in order to prevent damage such as punch-through of the gate insulating film 101 without causing the etching residue defective, the volume proportion of the HBr gas in the whole etching gas is preferably 10 through 70%.

(2) Second conditions employed when the etching gas is a mixed gas of $Cl_2$ and $N_2$:
Pressure: 0.4 Pa
First RF power: 400 W (13.56 MHz)
Second RF power: 60 W (13.56 MHz)
Flow rate of $Cl_2$ gas: 90 ml/min.
Flow rate of $N_2$ gas: 10 ml/min.
Temperature of sample table: 20° C.
Etching time: 10 seconds In the second etching conditions, the volume proportion of the $N_2$ gas in the whole etching gas is 5% or more. Therefore, a groove formed in the grain boundary of the n-type polysilicon film 105 can be reduced owing to the etching protection function of $SiN_x$ generated during the etching. As a result, damage such as punch-through of the gate insulating film 101 can be avoided.

When the volume proportion of the $N_2$ gas exceeds 40%, however, $Wn_x$ or $SiN_x$ is excessively generated during the etching, and hence, there is a fear of generation of a large amount of particles.

Accordingly, in order to prevent damage such as punch-through of the gate insulating film without generating particles, the volume proportion of the $N_2$ gas in the whole etching gas is preferably 5 through 40%.

(3) Third conditions employed when the etching gas is a mixed gas of $Cl_2$ and $O_2$:
Pressure: 0.4 Pa
First RF power: 400 W (13.56 MHz)
Second RF power: 60 W (13.56 MHz)
Flow rate of $Cl_2$ gas: 95 ml/min.
Flow rate of $O_2$ gas: 5 ml/min.
Temperature of sample table: 20° C.
Etching time: 10 seconds In the third conditions, the volume proportion of the $O_2$ gas in the whole etching gas is 2% or more. Therefore, a groove formed in the grain boundary of the n-type polysilicon film 105 can be reduced owing to the etching protection function of $SiO_x$ generated during the etching. As a result, damage such as punch-through of the gate insulating film 101 can be avoided.

When the volume proportion of the $O_2$ gas exceeds 10%, however, the etching rate of an oxide film is abruptly lowered, and hence, the natural oxide film present on the n-type and p-type polysilicon films 105 and 108 cannot be sufficiently removed. Therefore, there is a fear of defective of an etching residue caused after forming the polymetal electrodes.

Accordingly, in order to prevent damage such as punch-through of the gate insulating film without causing the etching residue defective, the volume proportion of the $O_2$ gas in the whole etching gas is preferably 2 through 20%.

Although a $Cl_2$ gas is used as the gas including chlorine in Embodiment 2, it goes without saying that another gas such as $BCl_3$ or HCl may be used instead of the $Cl_2$ gas for attaining the same effect.

Embodiment 3

A method for fabricating a semiconductor device according to Embodiment 3 of the invention will now be described. As a characteristic of Embodiment 3, in the case where a group V impurity is deposited in a grain boundary of a polysilicon film included in a polymetal structure, an etching gas used for removing a residue of a barrier film and a natural oxide film present on the polysilicon film is a mixed gas of a gas including chlorine and a fluorocarbon gas. The conditions for the etching of a tungsten film 110 and a tungsten nitride film 109 and the conditions for the main etching and the over-etching of an n-type polysilicon film 105 and a p-type polysilicon film 108 are the same as those employed in Embodiment 1. Accordingly, conditions for removing the residue and the natural oxide film alone will be herein described. In this embodiment, a $Cl_2$ gas is used as the gas including chlorine, and a $CF_4$ gas is used as the fluorocarbon gas.

(1) Conditions for removing residue and natural oxide film:

Pressure: 0.4 Pa
First RF power: 400 W (13.56 MHz)
Second RF power: 60 W (13.56 MHz)
Flow rate of $Cl_2$ gas: 95 ml/min.
Flow rate of $CF_4$ gas: 5 ml/min.
Temperature of sample table: 20° C.
Etching time: 10 seconds In these conditions, the volume proportion of the $CF_4$ gas in the whole etching gas is 3% or more. Therefore, a groove formed in the grain boundary of the n-type polysilicon film 105 can be reduced owing to an etching protection function of a fluorocarbon deposit film generated through decomposition of the etching gas, and hence, damage such as punch-through of a gate insulating film 101 can be avoided.

When the volume proportion of the $CF_4$ gas exceeds 20%, however, a CF-based polymer film generated through decomposition of the $CF_4$ gas is excessively deposited, and therefore, the residue of the tungsten nitride film and the natural oxide film present on the polysilicon film cannot be sufficiently removed. Therefore, there is a fear of defective of an etching residue caused after forming a polymetal electrode.

Accordingly, in order to prevent damage such as punch-through of the gate insulating film 101 without causing the etching residue defective, the volume proportion of the $CF_4$ gas in the whole etching gas is preferably 3 through 20%.

Although the $Cl_2$ gas is used as the gas including chlorine in Embodiment 3, a $BCl_3$ gas or a HCl gas may be used instead of the $Cl_2$ gas for attaining the same effect.

Also, although the $CF_4$ gas is used as the fluorocarbon gas in Embodiment 3, a $CHF_3$ gas, a $C_4F_8$ gas, a $C_2F_6$ gas or $CH_2F_2$ gas may be used instead of the $CF_4$ gas for attaining the same effect.

Embodiment 4

A method for fabricating a semiconductor device according to Embodiment 4 of the invention will now be described. As a characteristic of Embodiment 4, in the case where a group V impurity is deposited in a grain boundary of a polysilicon film included in a polymetal structure, an etching gas used for removing a residue of a barrier film and a natural oxide film present on the polysilicon film is a mixed gas of a gas including chlorine and an inert gas. The conditions for the etching of a tungsten film 110 and a tungsten nitride film 109 and the conditions for the main etching and the over-etching of an n-type polysilicon film 105 and a p-type polysilicon film 108 are the same as those employed in Embodiment 1. Accordingly, conditions for removing the residue and the natural oxide film alone will be herein described. In this embodiment, a $Cl_2$ gas is used as the gas including chlorine, and an Ar gas is used as the inert gas.

Figure 4:
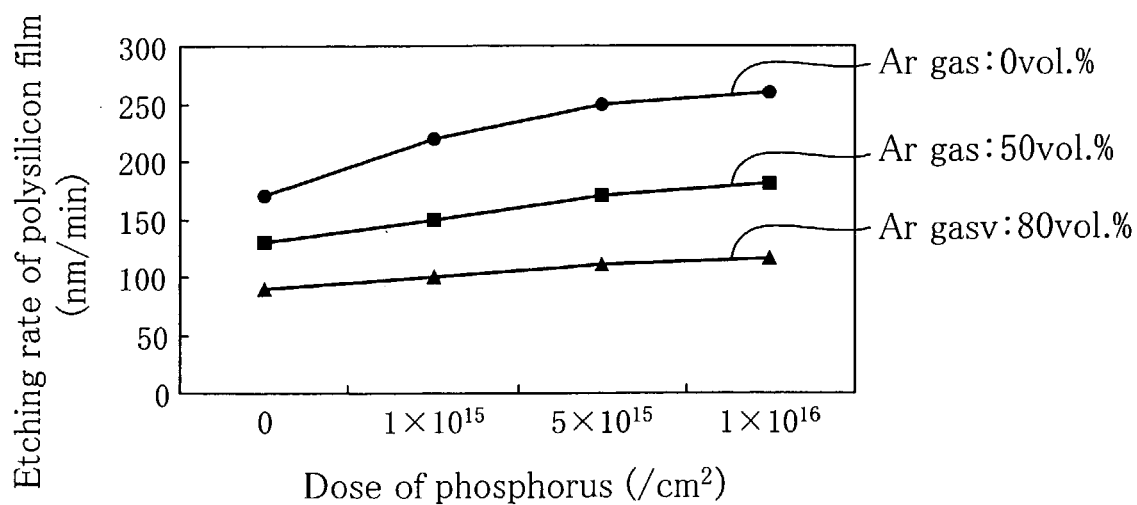
FIG. 4 is a diagram for showing the relationship between the volume proportion of an Ar gas in an etching gas used for removing a residue and a natural oxide film and a dose of an impurity implanted into a polysilicon film, and the etching rate of the polysilicon film in a method for fabricating a semiconductor device according to Embodiment 4.

(1) Conditions for removing residue and natural oxide film:

Pressure: 0.4 Pa
First RF power: 400 W (13.56 MHz)
Second RF power: 60 W (13.56 MHz)
Flow rate of $Cl_2$ gas: 20 ml/min.
Flow rate of Ar gas: 80 ml/min.
Temperature of sample table: 20° C.
Etching time: 15 seconds FIG. 4 is a graph for showing change of the etching rate of a polysilicon film obtained when the volume proportion of the Ar gas and a dose of the impurity in the polysilicon film are changed with the total flow rate of the mixed gas of the $Cl_2$ gas and the Ar gas kept constant at 100 ml/min. The abscissa of FIG. 4 indicates the dose of the impurity implanted into the polysilicon film, and the ordinate indicates the etching rate of the polysilicon film. Also, the volume proportion of the Ar gas is used as a parameter.

It is understood from FIG. 4 that as the volume proportion of the Ar gas is higher, the etching rate of the polysilicon film less depends upon the dose of the n-type impurity. This is because, when the volume proportion of the Ar gas is increased, the amount of chlorine radicals is reduced, so as to suppress a chemical reaction that largely depends upon the concentration of the n-type impurity.

On the basis of this experiment result, the residue of the tungsten nitride film 109 and the natural oxide film present on the n-type and p-type polysilicon films 105 and 108 were removed under the aforementioned conditions. As a result, when the volume proportion of the Ar gas exceeded 20%, a groove formed in the grain boundary of the n-type polysilicon film 105 could be reduced, so as to prevent damage such as punch-through of the gate insulating film.

Although the $Cl_2$ gas is used as the gas including chlorine in Embodiment 4, a $BCl_3$ gas or a HCl gas may be used instead of the $Cl_2$ gas for attaining the same effect.

Also, although the Ar gas is used as the inert gas in Embodiment 4, a He gas, a Ne gas, a Xe gas or a Kr gas may be used instead of the Ar gas for attaining the same effect.

Embodiment 5

A method for fabricating a semiconductor device according to Embodiment 5 of the invention will now be described. As a characteristic of Embodiment 5, in the case where a group V impurity is deposited in a grain boundary of a polysilicon film included in a polymetal structure, a residue of a barrier film and a natural oxide film present on the polysilicon film are removed while cooling a semiconductor substrate. The conditions for the etching of a tungsten film 110 and a tungsten nitride film 109 and the conditions for the main etching and the over-etching of an n-type polysilicon film 105 and a p-type polysilicon film 108 are the same as those employed in Embodiment 1. Accordingly, conditions for removing the residue and the natural oxide film alone will be herein described.

(1) Conditions for removing residue and natural oxide film:

Pressure: 0.4 Pa
First RF power: 400 W (13.56 MHz)
Second RF power: 60 W (13.56 MHz)
Flow rate of $Cl_2$ gas: 100 ml/min.
Temperature of sample table: 5° C.
Etching time: 15 seconds When the temperature of the sample table is lowered as in these conditions, a depositing property of a reaction product such as $SiCl_x$ generated during the etching is increased, so that a groove having been formed in the grain boundary of the n-type polysilicon film 105 can be covered with the reaction product. Therefore, increase of the groove formed in the grain boundary of the n-type polysilicon film 105 can be suppressed.

When the temperature of the sample table is 20° C. or less, the groove formed in the grain boundary of the n-type polysilicon film 105 can be reduced, so as to avoid damage such as punch-through of the gate insulating film.

When the temperature of the sample table is lower than 0° C., however, the cross-section of the etched film becomes a reverse tapered shape, and hence, there is a fear of lowering of controllability in the resultant dimension.

Accordingly, in order to prevent damage such as punch-through of the gate insulating film with securing the controllability of the resultant dimension, the temperature of the sample table is preferably 0 through 20° C.

Embodiment 6

A method for fabricating a semiconductor device according to Embodiment 6 of the invention will now be described with reference to FIGS. 5A through 5D and 6A through 6C. In Embodiment 6, in the case where a dose of a group V impurity implanted into an amorphous silicon film included in a polymetal structure exceeds the solubility limit in the silicon film, the temperature applied from the implantation of the group V impurity to dry etching of the polymetal structure is regulated.

Figure 5A:
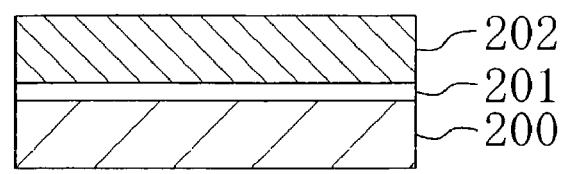
FIGS. 5A, 5B, 5C and 5D are cross-sectional views for showing procedures in a method for fabricating a semiconductor device according to Embodiment 6 of the invention.

First, as shown in FIG. 5A, after forming a gate insulating film 201 of a silicon oxide film with a thickness of, for example, 3 nm on a semiconductor substrate 200 of silicon or the like by, for example, the thermal oxidation, an amorphous silicon film 202 with a thickness of, for example, 100 nm is deposited on the gate insulating film 201 by, for example, the CVD.

Figure 5B:
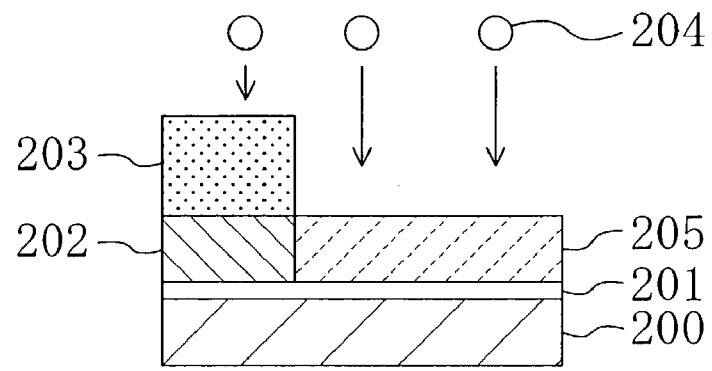

Next, as shown in FIG. 5B, after forming a first resist pattern 203 in a first predetermined portion on the amorphous silicon film 202, a group V impurity 204 of phosphorus (P) or the like is implanted into the amorphous silicon film 202 by the ion implantation at a dose of, for example, $5 \times 10^{16}/cm^2$, so as to form an n-type amorphous silicon film 205. Thus, the amount of the group V impurity doped in the n-type amorphous silicon film 205 is larger than the limit (solubility limit), that is, $1 \times 10^{20}/cm^3$.

Figure 5C:
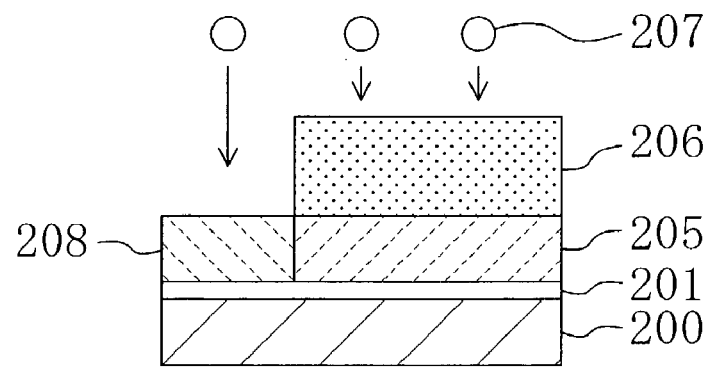

Then, as shown in FIG. 5C, after removing the first resist pattern 203 by the ashing and the cleaning, a second resist pattern 206 is formed in a second predetermined portion on the amorphous silicon film 202. Thereafter, a group III impurity 207 of boron (B) or the like is implanted into the amorphous silicon film 202 by the ion implantation at a dose of, for example, $3 \times 10^{15}/cm^2$, so as to form a p-type amorphous silicon film 208.

Figure 5D:
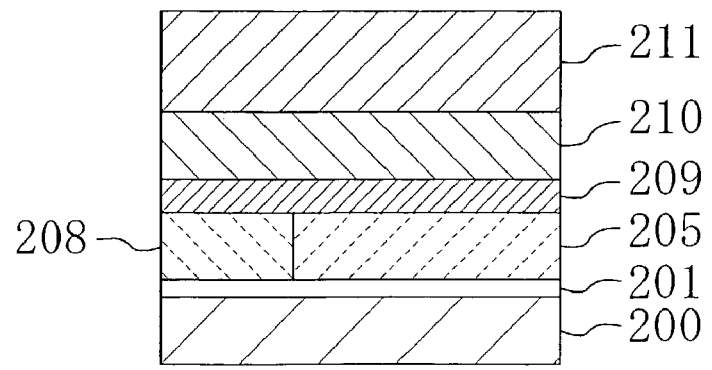

Subsequently, as shown in FIG. 5D, a tungsten nitride film 209 with a thickness of, for example, 10 nm and a tungsten film 210 with a thickness of, for example, 100 nm are deposited on the n-type amorphous silicon film 205 and the p-type amorphous silicon film 208 by the sputtering. Thereafter, a silicon nitride film 211 with a thickness of, for example, 150 nm is deposited on the tungsten film 210 by the plasma CVD. Since the tungsten nitride film 209 and the tungsten film 210 are deposited by the sputtering and the silicon nitride film 211 is deposited by the plasma CVD, the temperature of heat applied to the semiconductor substrate 200 during the deposition of these films is lower than a temperature at which the n-type and p-type amorphous silicon films 205 and 208 are crystallized, that is, 550° C.

Figure 6A:
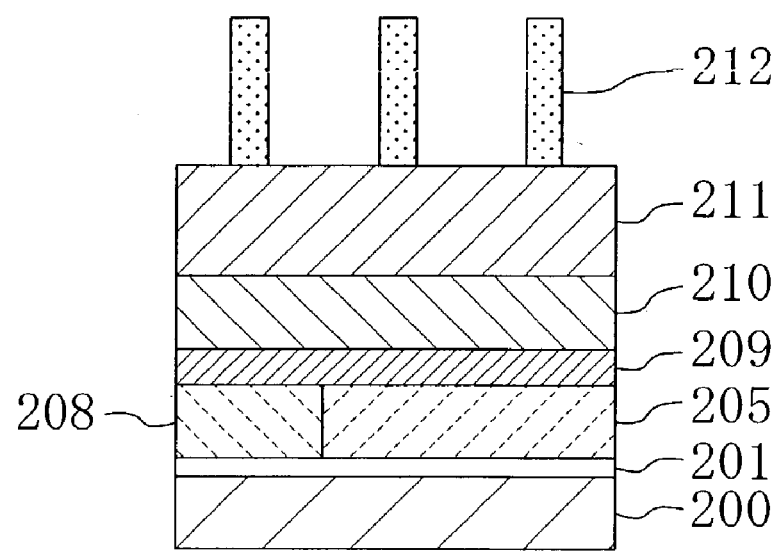
FIGS. 6A, 6B and 6C are cross-sectional views for showing other procedures in the method for fabricating a semiconductor device of Embodiment 6.

Next, as shown in FIG. 6A, after forming a chemically amplified resist film on the silicon nitride film 211, the chemically amplified resist film is subjected to the lithography using KrF excimer laser as exposing light, so as to form a third resist pattern 212.

Figure 6B:
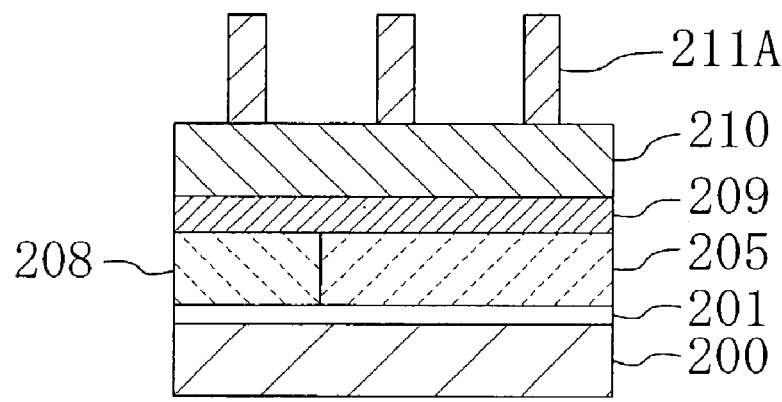

Then, the inductively coupled plasma etching system shown in FIG. 3 is used for etching the silicon nitride film 211 by using the third resist pattern 212 as a mask, so as to form a patterned silicon nitride film 211A working as a hard mask as shown in FIG. 6B. Thereafter, the third resist pattern 212 is removed by the ashing and the cleaning. The hard mask may be a patterned silicon oxide film instead of the patterned silicon nitride film 211A.

Figure 6C:
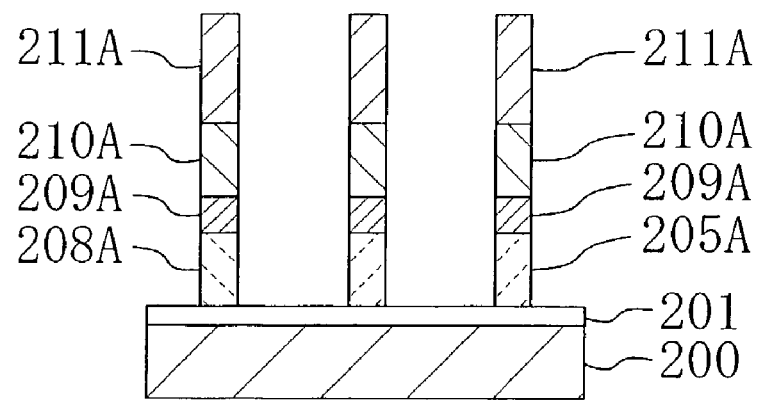

Subsequently, the inductively coupled plasma etching system shown in FIG. 3 is used for carrying out anisotropic etching on the tungsten film 210, the tungsten nitride film 209, the n-type amorphous silicon film 205 and the p-type amorphous silicon film 208 by using the patterned silicon nitride film 211A as shown in FIG. 6C, so as to form a patterned tungsten film 210A, a patterned tungsten nitride film 209A, a patterned n-type amorphous silicon film 205A and a patterned p-type amorphous silicon film 208A.

In Embodiment 6, all the procedures for forming the n-type amorphous silicon film 205 and the p-type amorphous silicon film 208, depositing the tungsten nitride film 209, depositing the tungsten film 210, forming the patterned silicon nitride film 211A working as a hard mask, and forming the patterned tungsten film 210A, the patterned tungsten nitride film 209A, the patterned n-type amorphous silicon film 205A and the patterned p-type amorphous silicon film 208A are performed at a temperature lower than 550° C. Therefore, the n-type amorphous silicon film 205A is not crystallized, and hence, growth of a grain boundary is suppressed in the n-type amorphous silicon film 205A. Accordingly, the deposition of the phosphorus (P) in the n-type amorphous silicon film 205A is suppressed. As a result, in the procedure for removing a residue of the tungsten nitride film 209 working as a barrier film and a natural oxide film present on the n-type and p-type amorphous silicon films 205 and 208, no groove is formed in a specific portion of the n-type amorphous silicon film 205. Thus, a polymetal gate electrode can be formed without causing punch-through in the gate insulating film 201 starting from the specific portion of the n-type amorphous silicon film 205.

Embodiment 7

A method for fabricating a semiconductor device according to Embodiment 7 of the invention will now be described with reference to FIGS. 7A through 7D and 8A through 8C. In Embodiment 7, in the case where a titanium nitride film is used as a barrier film, etching of the titanium nitride film and removal of a natural oxide film present on a polysilicon film are carried out under the same conditions and continuously.

Figure 7A:
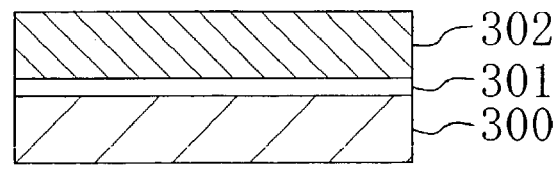
FIGS. 7A, 7B, 7C and 7D are cross-sectional views for showing procedures in a method for fabricating a semiconductor device according to Embodiment 7 of the invention.

First, as shown in FIG. 7A, after forming a gate insulating film 301 of a silicon oxide film with a thickness of, for example, 3 nm on a semiconductor substrate 300 of silicon or the like by, for example, the thermal oxidation, a polysilicon film 302 with a thickness of, for example, 100 nm is deposited on the gate insulating film 301 by, for example, the CVD.

Figure 7B:
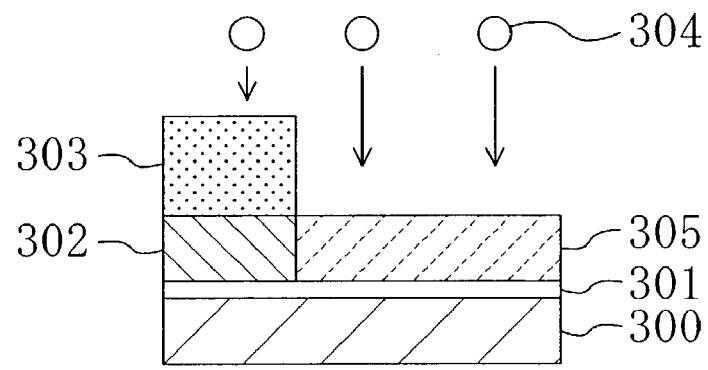

Next, as shown in FIG. 7B, after forming a first resist pattern 303 in a first predetermined portion on the polysilicon film 302, a group V impurity 304 of phosphorus (P) or the like is implanted into the polysilicon film 302 by the ion implantation at a dose of, for example, $5 \times 10^{14}/cm^2$, so as to form an n-type polysilicon film 305.

Figure 7C:
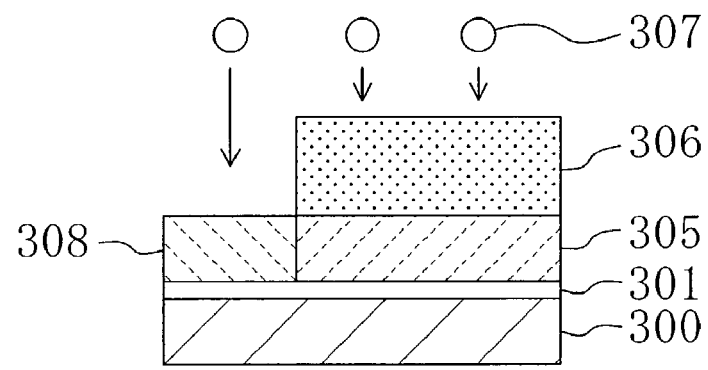

Then, as shown in FIG. 7C, after removing the first resist pattern 303 by the ashing and the cleaning, a second resist pattern 306 is formed in a second predetermined portion on the polysilicon film 302. Thereafter, a group III impurity 307 of boron (B) or the like is implanted into the polysilicon film 302 by the ion implantation at a dose of, for example, $1 \times 10^{15}/cm^2$, so as to form a p-type polysilicon film 308.

Figure 7D:
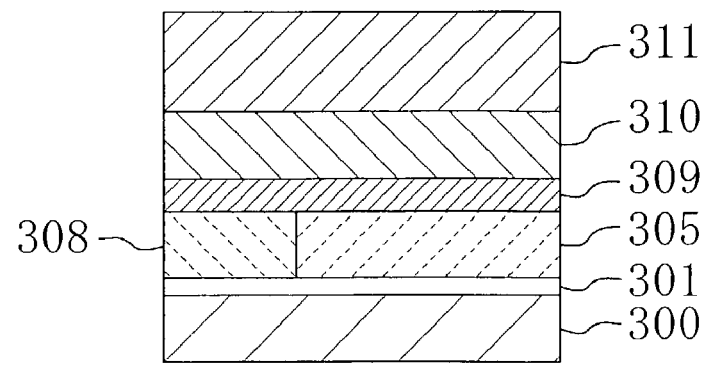

Subsequently, as shown in FIG. 7D, a titanium nitride film 309 with a thickness of, for example, 10 nm, a tungsten film 310 with a thickness of, for example 100 nm and a silicon nitride film 311 with a thickness of, for example, 150 nm are successively deposited on the n-type polysilicon film 305 and the p-type polysilicon film 308 by the sputtering or the CVD.

Figure 8A:
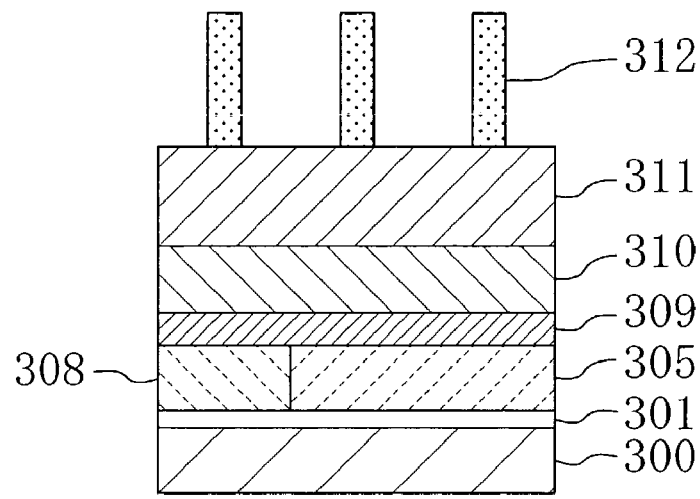
FIGS. 8A, 8B and 8C are cross-sectional views for showing other procedures in the method for fabricating a semiconductor device of Embodiment 7.

Next, as shown in FIG. 8A, after forming a chemically amplified resist film on the silicon nitride film 311, the chemically amplified resist film is subjected to the lithography using KrF excimer laser as exposing light, so as to form a third resist pattern 312.

Figure 8B:
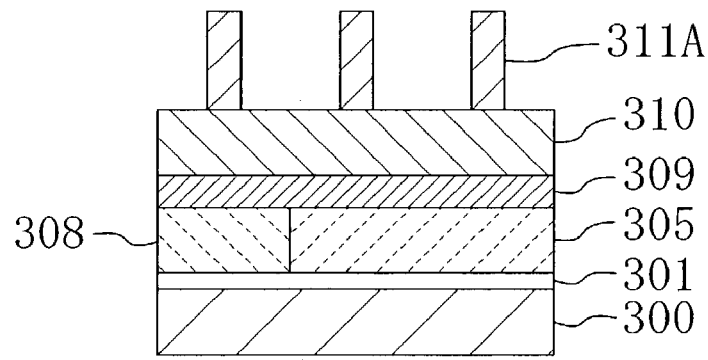
Figure 8C:
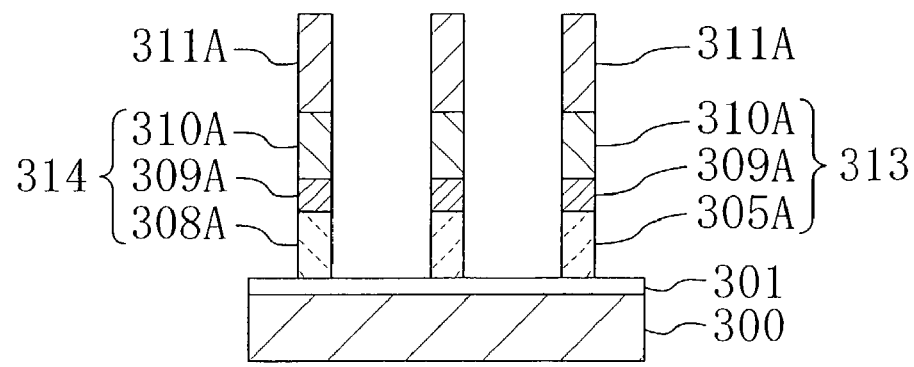

Then, the inductively coupled plasma etching system shown in FIG. 3 is used for etching the silicon nitride film 311 by using the third resist pattern 312 as a mask as shown in FIG. 8B, so as to form a patterned silicon nitride film 311A working as a hard mask. Thereafter, the third resist pattern 312 is removed by the ashing and the cleaning. The hard mask may be a patterned silicon oxide film instead of the patterned silicon nitride film 311A.

Next, the same inductively coupled plasma etching system shown in FIG. 3 is used for carrying out the anisotropic etching on the tungsten film 310, the titanium nitride film 309, the n-type polysilicon film 305 and the p-type polysilicon film 308 by using the patterned silicon nitride film 311A as a mask. Thus, a patterned tungsten film 310A, a patterned titanium nitride film 309A, a patterned n-type polysilicon film 305A and a patterned p-type polysilicon film 308A are formed.

In this manner, an n-type polymetal gate electrode 313 composed of the patterned tungsten film 310A, the patterned titanium nitride film 309A and the patterned n-type polysilicon film 305A is formed, and a p-type polymetal gate electrode 314 composed of the patterned tungsten film 310A, the patterned titanium nitride film 309A and the patterned p-type polysilicon film 308A is formed.

Now, the conditions for the etching for forming the polymetal gate electrodes in Embodiment 7 will be described.

(1) Conditions for etching of tungsten film 310:
Pressure: 1 Pa
First RF power: 400 W (13.56 MHz)
Second RF power: 30 W (13.56 MHz)
Flow rate of $CF_4$ gas: 100 ml/min.
Flow rate of $O_2$ gas: 20 ml/min.
Flow rate of HBr gas: 5 ml/min.
Flow rate of $N_2$ gas: 2 ml/min.
Temperature of sample table: 20° C.
The etching time is determined through the automatic end point detection by measuring emission frequency of $WF_x$.

(2) Conditions for etching of titanium nitride film 309 and removal of natural oxide film present on n-type polysilicon film 305 and p-type polysilicon film 308:
Pressure: 1 Pa
First RF power: 400 W (13.56 MHz)
Second RF power: 60 W (13.56 MHz)
Flow rate of $Cl_2$ gas: 100 ml/min.
Temperature of sample table: 20° C.
Etching time: 10 seconds (3) Conditions for main etching of n-type polysilicon film 305 and p-type polysilicon film 308:
Pressure: 0.4 Pa
First RF power: 400 W (13.56 MHz)
Second RF power: 20 W (13.56 MHz)
Flow rate of $Cl_2$ gas: 50 ml/min.
Flow rate of HBr gas: 50 ml/min.
Flow rate of $O_2$ gas: 2 ml/min.
Temperature of sample table: 20° C.
The etching time is determined through the automatic end point detection by measuring emission frequency of $SiBr_x$.

(4) Conditions for over-etching of n-type polysilicon film 305 and p-type polysilicon film 308:
Pressure: 3 Pa
First RF power: 400 W (13.56 MHz)
Second RF power: 50 W (13.56 MHz)
Flow rate of HBr gas: 100 ml/min.
Flow rate of $O_2$ gas: 10 ml/min.
Temperature of sample table: 20° C.
Etching time: 50 seconds In Embodiment 7, since the $Cl_2$ gas is used for etching the titanium nitride film 309, polycrystal generated during the etching is $TiCl_x$ having high volatility. Therefore, during the etching of the titanium nitride film 309, a residue that has large bonding energy and a high boiling point, such as $TiO_x$ or $TiF_x$, is not generated.

Also, under the conditions for etching the titanium nitride film 309 and removing the natural oxide film present on the n-type and p-type polysilicon films 305 and 308, the etching rate of the gate insulating film 301 is approximately 50 nm/min., and therefore, the natural oxide film can be sufficiently removed through the etching of approximately 2 through 3 seconds.

Accordingly, in the case where the titanium nitride film 309 is used as the barrier film of the polymetal structure, when the etching of the titanium nitride film 309 and the removal of the natural oxide film are carried out continuously under the conditions using the $Cl_2$ gas, the amount of the n-type and p-type polysilicon films 305 and 308 etched in patterning the titanium nitride film 309 and removing the natural oxide film can be reduced. Therefore, in the main etching of the n-type and p-type polysilicon films 305 and 308, the etching end point can be stably detected, so as to prevent damage such as punch-through of the gate insulating film 301.

Although the $Cl_2$ gas is used as a gas including chlorine in Embodiment 7, another gas such as $BCl_3$ or HCl can be used instead of the $Cl_2$ gas for attaining the same effect.

Embodiment 8

A method for fabricating a semiconductor device according to Embodiment 8 of the invention will now be described. In Embodiment 8, in the case where a titanium nitride film is used as a barrier film, a mixed gas of a gas including chlorine and an inert gas is used for etching the titanium nitride film and removing a natural oxide film present on a polysilicon film.

In Embodiment 7, the $Cl_2$ gas is used in patterning the titanium nitride film 309 and removing the natural oxide film present on the polysilicon film, and in this case, the following problem may occur: In the case where each of the n-type and p-type polysilicon films 305 and 308 has a thickness of 80 nm or less, the n-type and p-type polysilicon films 305 and 308 are excessively etched in the etching for patterning the titanium nitride film 309 and removing the natural oxide film. As a result, the etching end point cannot be stably detected in the main etching of the n-type and p-type polysilicon films 305 and 308, and hence, there is a fear of punch-through caused in the gate insulating film 301.

Accordingly, in Embodiment 8, a mixed gas of a gas including chlorine and an inert gas is used for patterning the titanium nitride film 309 and removing the natural oxide film, so as not to excessively etch the n-type and p-type polysilicon films 305 and 308.

As a characteristic of Embodiment 8, the mixed gas of a gas including chlorine and an inert gas is used as an etching gas for patterning the titanium nitride film 309 and removing the natural oxide film. The conditions for the etching of a tungsten film 310 and the conditions for the main etching and the over-etching of the n-type polysilicon film 305 and the p-type polysilicon film 308 are the same as those employed in Embodiment 7. Therefore, conditions for patterning the titanium nitride film 309 and removing the natural oxide film alone will be herein described.

Figure 9:
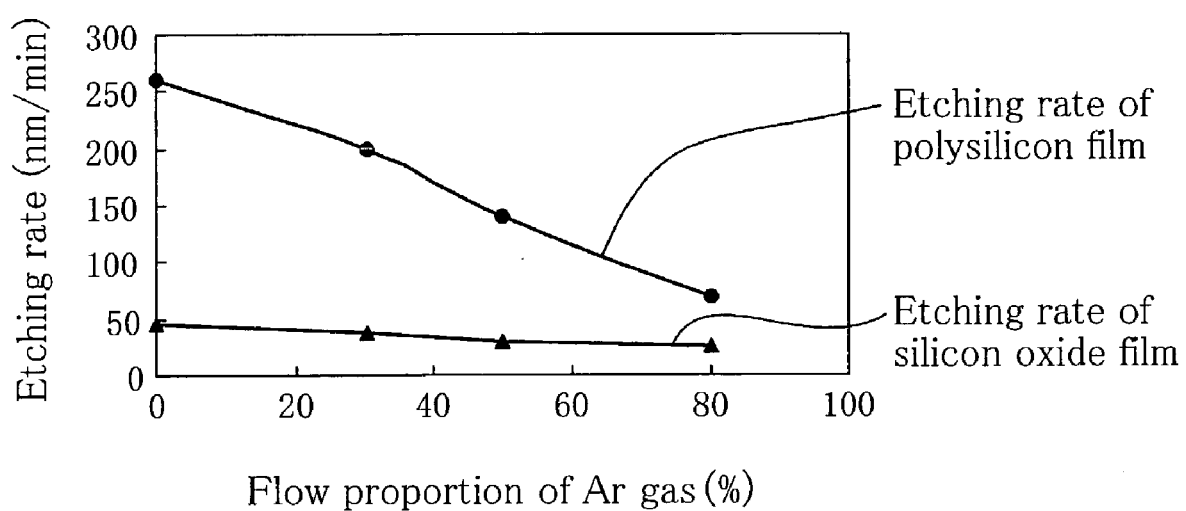
FIG. 9 is a diagram for showing the relationship between the volume proportion of an Ar gas in an etching gas used for patterning a titanium nitride film and removing a natural oxide film and the etching rates of a polysilicon film and a silicon oxide film in a method for fabricating a semiconductor device according to Embodiment 8 of the invention.
Figure 10A:
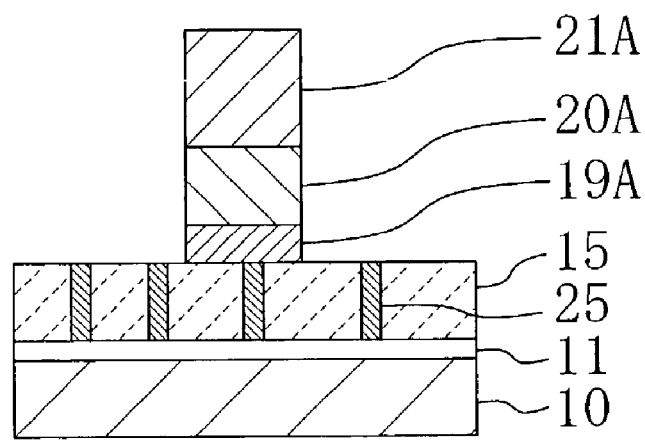
FIGS. 10A, 10B and 10C are cross-sectional views for explaining that damage such as punch-through of a gate insulating film starting from a grain boundary of a silicon film can be prevented even when a group V impurity present in the silicon film is excessively deposited in the grain boundary.
Figure 10B:
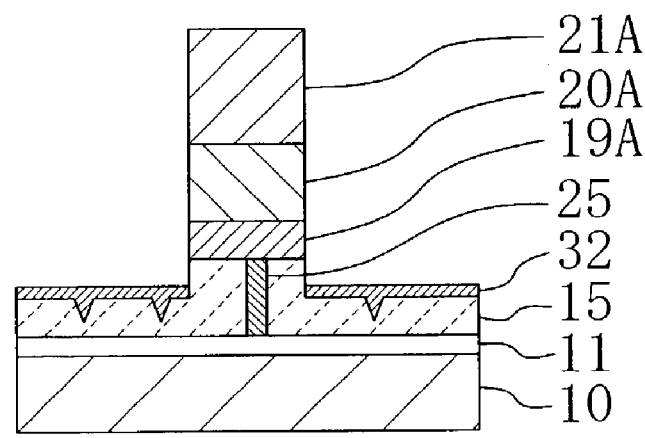
Figure 10C:
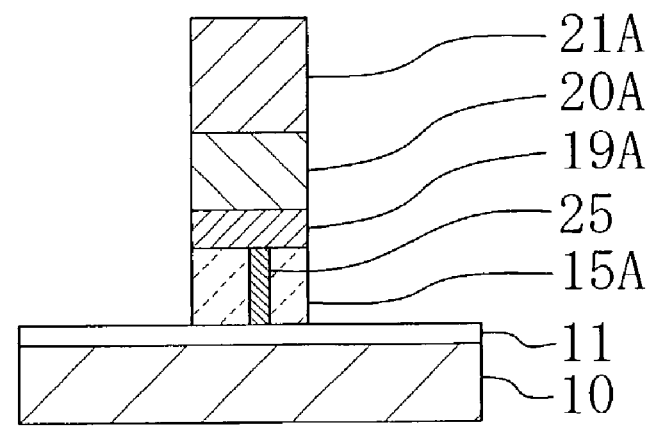
Figure 11A:
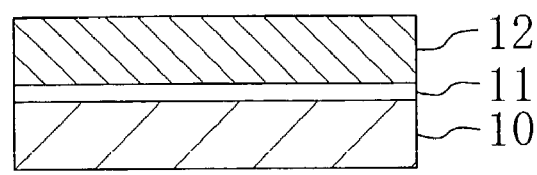
FIGS. 11A, 11B, 11C and 11D are cross-sectional views for showing procedures in a conventional method for fabricating a semiconductor device.
Figure 11B:
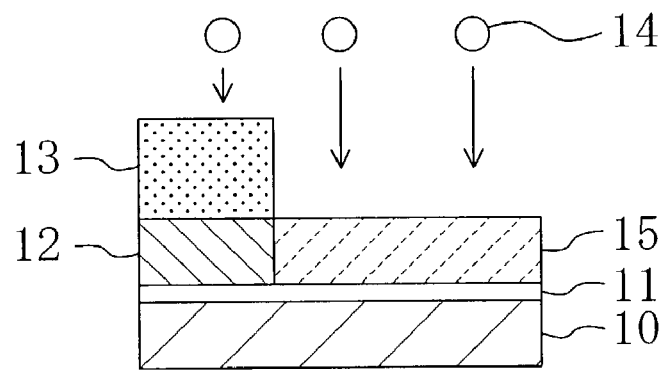
Figure 11C:
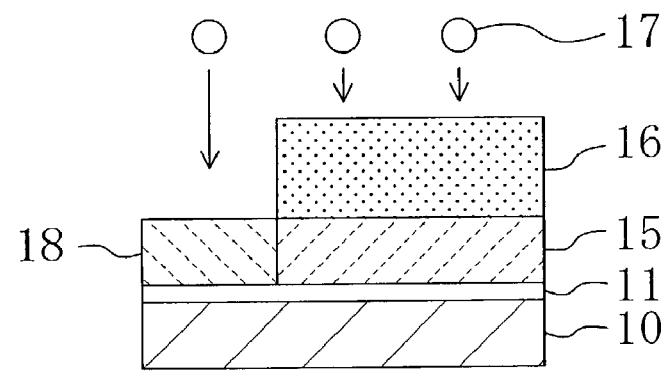
Figure 11D:
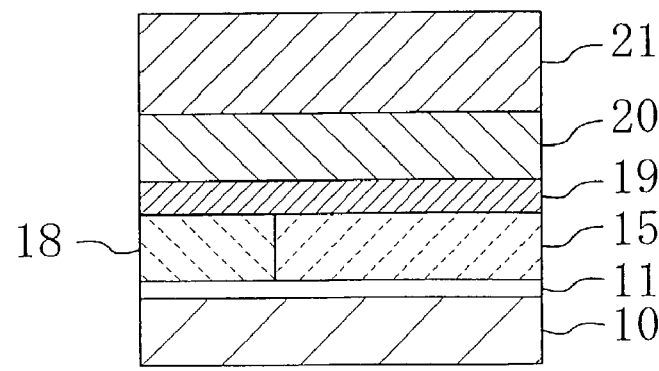
Figure 12A:
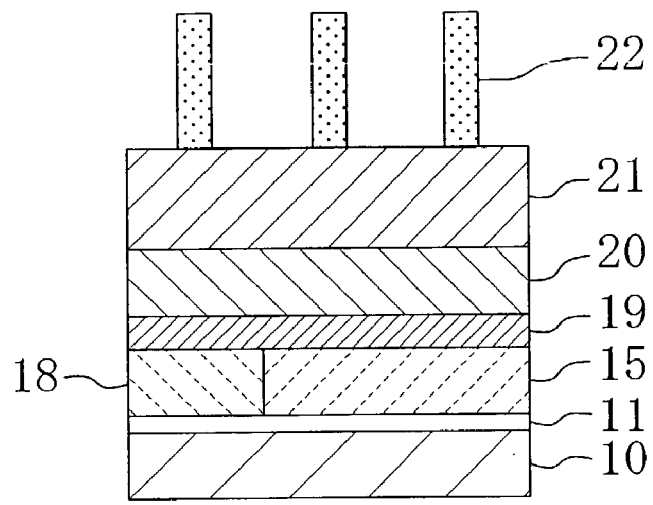
FIGS. 12A, 12B and 12C are cross-sectional views for showing other procedures in the conventional method for fabricating a semiconductor device.
Figure 12B:
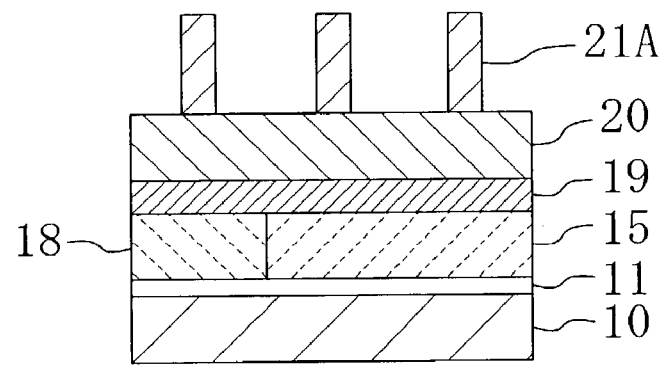
Figure 12C:
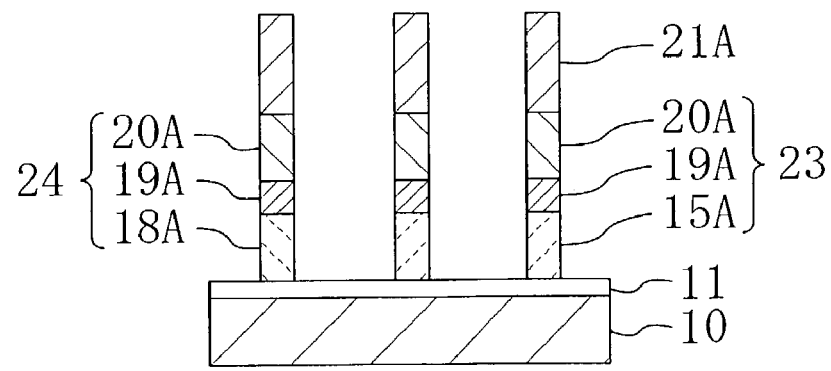
Figure 13A:
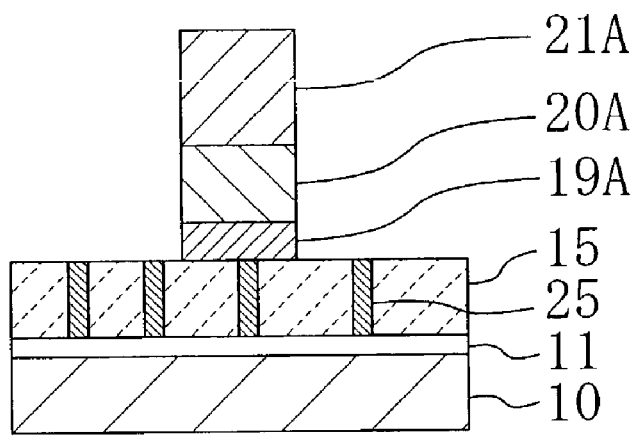
FIGS. 13A, 13B and 13C are cross-sectional views for explaining a first cause of punch-through caused in a gate insulating film in the conventional method for fabricating a semiconductor device.
Figure 13B:
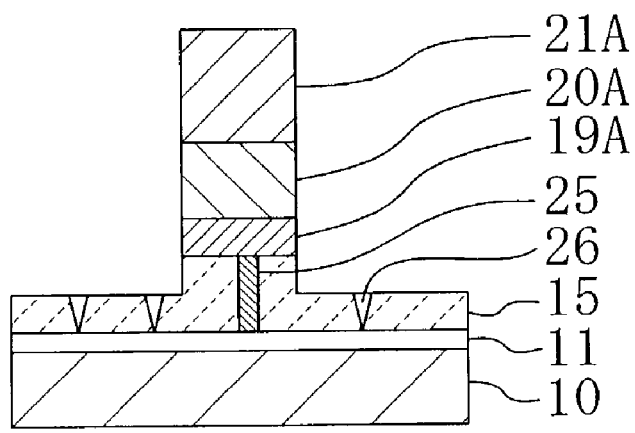
Figure 13C:
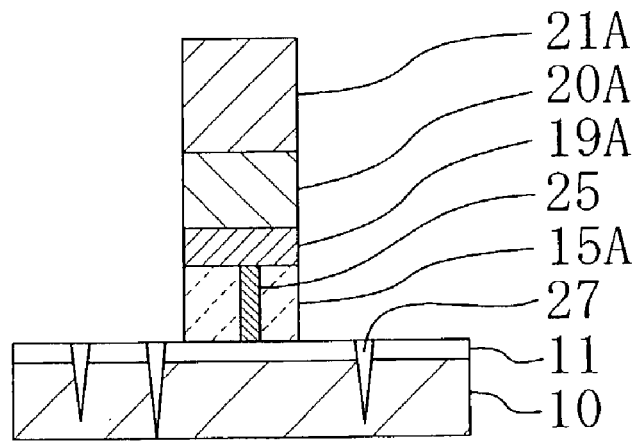
Figure 14A:
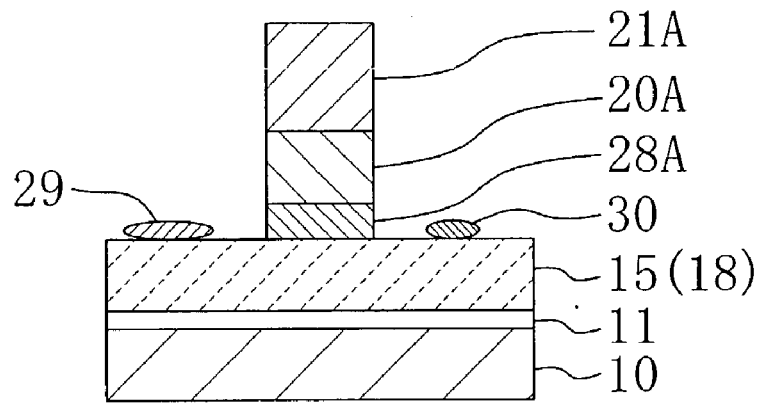
FIGS. 14A, 14B and 14C are cross-sectional views for explaining a second cause of punch-through caused in a gate insulating film in the conventional method for fabricating a semiconductor device.
Figure 14B:
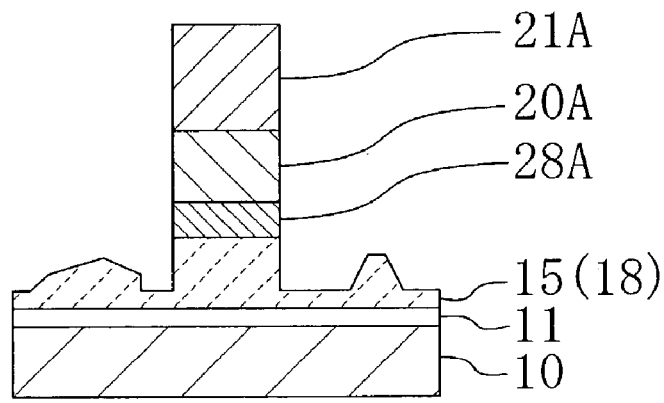
Figure 14C:
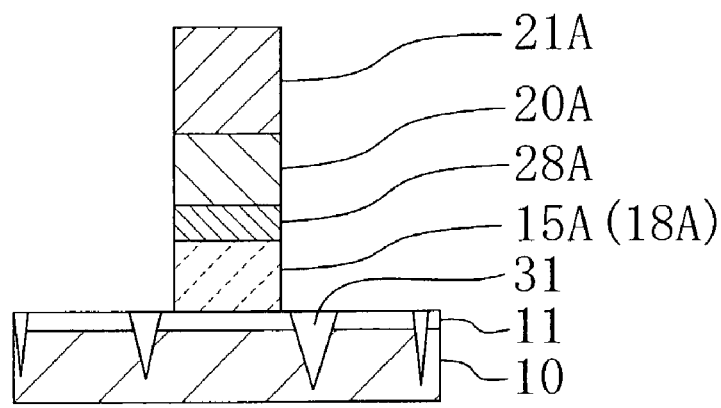

(1) Conditions for patterning titanium nitride film 309 and removing natural oxide film:
Pressure: 1 Pa
First RF power: 400 W (13.56 MHz)
Second RF power: 60 W (13.56 MHz)
Flow rate of $Cl_2$ gas: 50 ml/min.
Flow rate of Ar gas: 50 ml/min.
Temperature of sample table: 20° C.
Etching time: 15 seconds FIG. 9 shows dependency of the etching rates of a polysilicon film and a silicon oxide film on the volume proportion of the Ar gas, wherein the abscissa indicates the volume proportion of the Ar gas and the ordinate indicates the etching rate of the polysilicon film and the etching rate of the silicon oxide film. The total flow rate of the $Cl_2$ gas and the Ar gas is constant at 100 ml/min.

It is understood from FIG. 9 that when the flow rate of the Ar gas is increased, the etching rate of the polysilicon film is abruptly lowered while the etching rate of the silicon oxide film is gently lowered. Accordingly, when the volume proportion of the Ar gas in the whole etching gas is increased, the etching rate of the n-type and p-type polysilicon films 305 and 308 can be lowered without increasing the etch selectivity with the gate insulating film 301. Accordingly, when the mixed gas of the $Cl_2$ gas and the Ar gas is used as the etching gas, the patterning of the titanium nitride film 309 and the removal of the natural oxide film can be carried out while preventing excessive etching of the n-type and p-type polysilicon films 305 and 308.

The present inventor actually performed the etching under the aforementioned conditions, and thus, the excessive etching of the n-type and p-type polysilicon films 305 and 308 could be prevented and the etching end point could be stably detected in the main etching of the n-type and p-type polysilicon films 305 and 308, so that damage such as punch-through of the gate insulating film could be avoided.

Although the polysilicon film 302 has a thickness of 80 nm in Embodiment 8, even when the polysilicon film 302 has a thickness of 50 nm, the etching end point can be stably detected in the main etching of the polysilicon films by setting the volume proportion of the Ar gas to 80%, so as to avoid damage such as punch-through of the gate insulating film.

Although the $Cl_2$ gas is used as the gas including chlorine in Embodiment 8, another gas such as a $BCl_3$ gas or a HCl gas may be used instead of the $Cl_2$ gas for attaining the same effect.

Also, although the Ar gas is used as the inert gas in Embodiment 8, another inert gas such as a He gas, a Ne gas, a Xe gas or a Kr gas may be used instead of the Ar gas for attaining the same effect.

In each embodiment of the invention, the ICP (Inductively Coupled Plasma) dry etching system shown in FIG. 3 is used. Instead, another dry etching system including a plasma source of, for example, an RIE (Reactive Ion Etching) method, an ECR (Electron Cyclotron Resonance) method or the like may be used for attaining the same effect.

What is claimed is:

1. A method for fabricating a semiconductor device comprising the steps of:
    forming a gate insulating film on a semiconductor substrate;
    depositing a silicon film on said gate insulating film;
    depositing a high-melting point metal film on said silicon film;
    forming a hard mask made of a silicon oxide film or a silicon nitride film on said high-melting point metal film;
    dry etching said high-melting point metal film with said hard mask used as a mask;
    removing a residue or a natural oxide film present on said silicon film through dry etching; and
    dry etching said silicon film with said hard mask used as a mask,
    wherein the silicon film before the step of removing a residue or a natural oxide film is a polysilicon film, and
    the step of removing a residue or a natural oxide film is performed using a mixed gas in which a gas including chlorine and an HBr gas are mixed together while suppressing a difference between an etching rate in a grain boundary of the polysilicon film and an etching rate in the other portion of the polysilicon film and a formation of a groove in the grain boundary of the polysilicon film.

2. The method for fabricating a semiconductor device of claim 1, wherein the silicon film includes a group V impurity and a concentration of the group V impurity is higher than a solubility limit in the silicon film.

3. The method for fabricating a semiconductor device of claim 2, wherein the group V impurity is deposited in the grain boundary in the silicon film.

4. A method for fabricating a semiconductor device comprising the steps of:
    forming a gate insulating film on a semiconductor substrate;
    depositing a silicon film on said gate insulating film;
    depositing a high-melting point metal film on said silicon film;
    forming a hard mask made of a silicon oxide film or a silicon nitride film on said high-melting point metal film;
    dry etching said high-melting point metal film with said hard mask used as a mask;
    removing a residue or a natural oxide film present on said silicon film through dry etching; and
    dry etching said silicon film with said hard mask used as a mask,
    wherein said silicon film is an amorphous silicon film, and
    the step of removing a residue or a natural oxide film deposited on the gate insulating film is carried out while keeping said silicon film in amorphous condition.

5. The method for fabricating a semiconductor device of claim 4, wherein each of the step of depositing a high-melting point metal film, the step of forming a hard mask and the step of removing a residue or a natural oxide film is carried out at a temperature at which the amorphous silicon film is not crystallized, the temperature being less than 550° C.

* * * * *